United States Patent
Jun et al.

(10) Patent No.: US 10,506,714 B2
(45) Date of Patent: Dec. 10, 2019

(54) MEMS FILM FOR SEMICONDUCTOR DEVICE TEST SOCKET INCLUDING MEMS BUMP

(71) Applicant: Okins Electronics Co., Ltd., Gyeonggi-do (KR)

(72) Inventors: Jin Kook Jun, Gyeonggi-do (KR); Sung Gye Park, Gyeonggi-do (KR); Jae Weon Shim, Gyeonggi-do (KR); Sang Hoon Cha, Hwaseong-si (KR)

(73) Assignee: Okins Electronics Co., Ltd., Uiwang-si (KR)

( * ) Notice: Subject to any disclaimer, the term of this patent is extended or adjusted under 35 U.S.C. 154(b) by 107 days.

(21) Appl. No.: 14/919,442

(22) Filed: Oct. 21, 2015

(65) Prior Publication Data
US 2017/0027056 A1   Jan. 26, 2017

(30) Foreign Application Priority Data

Jul. 21, 2015   (KR) ........................ 10-2015-0103123

(51) Int. Cl.
| | |
|---|---|
| *H05K 1/11* | (2006.01) |
| *H05K 1/02* | (2006.01) |
| *G01R 1/04* | (2006.01) |
| *G01R 1/073* | (2006.01) |

(52) U.S. Cl.
CPC ............ *H05K 1/11* (2013.01); *G01R 1/0466* (2013.01); *H05K 1/028* (2013.01); *G01R 1/0483* (2013.01); *G01R 1/0735* (2013.01); *G01R 1/07342* (2013.01); *H05K 2201/0364* (2013.01)

(58) Field of Classification Search
None
See application file for complete search history.

(56) References Cited

U.S. PATENT DOCUMENTS

| | | | | |
|---|---|---|---|---|
| 5,172,050 A | * | 12/1992 | Swapp | G01R 1/0735 324/72.5 |
| 5,207,585 A | * | 5/1993 | Byrnes | G01R 1/06711 439/591 |
| 5,759,047 A | * | 6/1998 | Brodsky | H01L 23/49811 439/66 |

(Continued)

FOREIGN PATENT DOCUMENTS

| | | |
|---|---|---|
| CN | 1333452 | 8/2007 |
| CN | 1333452 C | 8/2007 |

(Continued)

*Primary Examiner* — Paresh Patel
(74) *Attorney, Agent, or Firm* — Reinhart Boerner Van Deuren P.C.

(57) ABSTRACT

A microelectromechanical system (MEMS) film for a test socket is arranged between a semiconductor device and a test apparatus for performing an electrical test of the semiconductor device and includes a flexible bare film and a plurality of round-type MEMS bumps on the bare film, each of the MEMS bumps being formed on the bare film by using a MEMS processing technique, having an electrical contact with an electrode pad of the test apparatus or a conductive ball of the semiconductor device, and having a contact surface rounded from an edge side toward a center side in a convex manner in a direction toward the electrode pad or the conductive ball.

2 Claims, 16 Drawing Sheets

(56) References Cited

U.S. PATENT DOCUMENTS

| | | | | |
|---|---|---|---|---|
| 6,094,058 A * | 7/2000 | Hembree | ............. | G01R 1/0433 |
| | | | | 257/E21.509 |
| 7,501,839 B2 * | 3/2009 | Chan | ................. | G01R 1/06711 |
| | | | | 324/754.18 |
| 7,503,769 B2 * | 3/2009 | Ohtsuki | ................. | H01R 9/096 |
| | | | | 439/354 |
| 8,466,371 B2 * | 6/2013 | Spory | .................... | H05K 3/326 |
| | | | | 174/254 |
| 2007/0068700 A1 * | 3/2007 | Ohtsuki | ............ | B23K 26/0661 |
| | | | | 174/261 |
| 2009/0061175 A1 | 3/2009 | Kim | | |
| 2009/0189620 A1 * | 7/2009 | Audette | ............... | G01R 1/0735 |
| | | | | 324/754.18 |

FOREIGN PATENT DOCUMENTS

| | | |
|---|---|---|
| CN | 203340284 U | 12/2013 |
| JP | 2011081004 | 4/2011 |
| JP | 2011081004 A | 4/2011 |
| JP | 2013508745 | 3/2013 |
| JP | 2013508745 A | 3/2013 |
| JP | 2014054718 | 3/2014 |
| JP | 2014054718 A | 3/2014 |
| KR | 10-2008-0060078 A | 7/2008 |
| KR | 10-2011-0087437 A | 8/2011 |
| KR | 10-1469222 B | 12/2014 |
| TW | 201000910 A | 1/2010 |
| TW | 201015085 | 4/2010 |
| TW | 201015085 A | 4/2010 |

* cited by examiner

```
[ OP_SH : TNO(1) ]
CA0    :  .....  .....    0.00V   .....
CA1    :  .....  .....  -251.93mV .....
CA2    :  .....  .....  -241.86mV .....
CA3    :  .....  .....  -243.69mV .....
CA4    :  .....  .....  -222.32mV .....
CA5    :  .....  .....  -244.30mV .....
CA6    :  .....  .....    -2.29mV .....
CA7    :  .....  .....    0.00V   .....
CA8    :  .....  .....  -225.60mV .....
CA9    :  .....  .....  -223.24mV .....
DQ0    :  .....  .....    0.00V   .....
DQ1    :  .....  .....    0.00V   .....
DQ2    :  .....  .....   -1.07mV  .....
DQ3    :  .....  .....   -4.96V   .....
DQ4    :  .....  .....   -4.93V   .....
DQ5    :  .....  .....   -4.95V   .....
DQ6    :  .....  .....   -1.37mV  .....
DQ7    :  .....  .....    0.00V   .....
DQ8    :  .....  .....   -4.92V   .....
DQ9    :  .....  .....   -4.94V   .....
DQ10   :  .....  .....   -4.94V   .....
DQ11   :  .....  .....   -4.97V   .....
DQ12   :  .....  .....   -4.92V   .....
DQ13   :  .....  .....   -4.95V   .....
DQ14   :  .....  .....   -4.93V   .....
DQ15   :  .....  .....   -4.95V   .....
DQ16   :  .....  .....  -360.57mV .....
DQ17   :  .....  .....  -363.01mV .....
DQ18   :  .....  .....   -2.23mV  .....
DQ19   :  .....  .....   -4.96V   .....
```

| | | | | |
|---|---|---|---|---|
| CA0 | : | ...... ...... | -334.94mV | ..... |
| CA1 | : | ...... ...... | -361.79mV | ..... |
| CA2 | : | ...... ...... | -360.27mV | ..... |
| CA3 | : | ...... ...... | -362.71mV | ..... |
| CA4 | : | ...... ...... | -335.24mV | ..... |
| CA5 | : | ...... ...... | -337.38mV | ..... |
| CA6 | : | ...... ...... | -334.94mV | ..... |
| CA7 | : | ...... ...... | -339.51mV | ..... |
| CA8 | : | ...... ...... | -332.49mV | ..... |
| CA9 | : | ...... ...... | -336.46mV | ..... |
| DQ0 | : | ...... ...... | -239.41mV | ..... |
| DQ1 | : | ...... ...... | -242.47mV | ..... |
| DQ2 | : | ...... ...... | -241.86mV | ..... |
| DQ3 | : | ...... ...... | -242.77mV | ..... |
| DQ4 | : | ...... ...... | -243.08mV | ..... |
| DQ5 | : | ...... ...... | -245.21mV | ..... |
| DQ6 | : | ...... ...... | -240.33mV | ..... |
| DQ7 | : | ...... ...... | -244.30mV | ..... |
| DQ8 | : | ...... ...... | -239.11mV | ..... |
| DQ9 | : | ...... ...... | -242.16mV | ..... |
| DQ10 | : | ...... ...... | -241.25mV | ..... |
| DQ11 | : | ...... ...... | -241.86mV | ..... |
| DQ12 | : | ...... ...... | -242.77mV | ..... |
| DQ13 | : | ...... ...... | -245.52mV | ..... |
| DQ14 | : | ...... ...... | -239.72mV | ..... |
| DQ15 | : | ...... ...... | -242.77mV | ..... |
| DQ16 | : | ...... ...... | -240.33mV | ..... |
| DQ17 | : | ...... ...... | -243.99mV | ..... |
| DQ18 | : | ...... ...... | -242.77mV | ..... |
| DQ19 | : | ...... ...... | -243.08mV | ..... |
| DQ20 | : | ...... ...... | -243.38mV | ..... |
| DQ21 | : | | -246.43mV | |

FIG.7c

MEMS FILM FOR SEMICONDUCTOR DEVICE TEST SOCKET INCLUDING MEMS BUMP

CROSS-REFERENCE TO RELATED APPLICATIONS

This application claims the benefit of Korean Patent Application No. 10-2015-0103123 filed with the Korean Intellectual Property Office on Jul. 21, 2015, the disclosure of which is incorporated herein by reference.

BACKGROUND

1. Field

The present disclosure relates to a microelectromechanical (MEMS) film for a semiconductor device test socket, including a bump with improved contact property.

2. Description of the Related Art

In general, a surface mounting semiconductor device such as an integrated circuit (IC) device or an IC package includes a land grid array (LGA), a ball grid array (BGA), a chip sized package (CSP), or the like. Such a semiconductor device needs to be tested to confirm its reliability before shipping to a customer.

As an example of such a test, a burn-in test is often used before a semiconductor device is applied to an electronic apparatus, to investigate whether the semiconductor device meets a required condition by applying a temperature and a voltage higher than those under a normal operation condition to the semiconductor device.

Referring to FIG. 1, in the case of a test socket 10, in a general test process, a semiconductor device 2 is mounted on the test socket 10 and then coupled to a device under test (DUT) board (not shown) to perform a test, for verifying durability and reliability of the device.

For example, electrical characteristics of the device are tested through an electrical contact between the test socket 10 and a conductive solder ball (not shown) of the semiconductor device 2 in a state in which the semiconductor device 2 is accommodated in the test socket 10, and in this case, a contact assembly P including a contact wire or a contact pin 12 as a means for achieving the contact therebetween, in order to smoothly perform the test in a repeated manner while reducing contact resistance and physical damage.

With recent downsizing of electronic products, a contact terminal of the semiconductor device 2 incorporated in each of the electronic products is also downsized and a pitch between contact terminals is narrowed accordingly. Therefore, in many cases, a pitch between contact wires or contact pins 12 of the test socket 10, which has been normally used, is too wide to be used for a test of the downsized semiconductor device.

In addition, the contact wire or the contact pin 12 is integrally bonded with a test board of a test apparatus through a soldering process, and hence, when a problem occurs in the test socket 10, the entire assembly may be disposed because the test socket 10 can hardly be separated from the test board.

As an attempt to cope with these problems, Korean Patent No. 1469222 and Korean Patent No. 1425606 describe a contact assembly in which a contact is formed by a MEMS process in order to achieve a fine pitch.

Referring to FIG. 2, a test socket 20 includes a base film 22 enclosing a block 24 and a conductive bump 26 that is MEMS processed on an upper surface of the base film 22. The base film 22 and the block 24 constitute a contact assembly P together with the conductive bump 26 that is electrically connected to a conductive ball 34 of a semiconductor device 32.

However, the test socket 20 shown in FIG. 2 still has a problem that a contact between the bump 26 and the ball 34 is remarkably degraded for the following reasons.

Firstly, a vertical deviation h in the height of the ball 34 may cause a contact fail.

Secondly, although the base film 22 is formed of a flexible material, the base film 22 may be hardened when the bump 26 and the ball 34 are brought into contact with each other, causing a contact fail.

Thirdly, as a contact area of the bump 26 is flat, the contact is degraded, and hence an electrical connection may be failed though a physical contact is achieved, causing a contact fail.

SUMMARY

The present disclosure has been achieved in view of the above aspects, and it is an object of the present disclosure to provide a MEMS film for a test socket, which does not cause a contact fail even with a deviation in the height or the size of a ball of a semiconductor device.

It is another object of the present disclosure to provide a MEMS film for a test socket in which hardening of a bare film processed is resolved and a MEMS element of the test socket is brought into contact with a semiconductor device in a flexible manner.

It is still another object of the present disclosure to provide a MEMS film for a test socket in which an electrical contact property is improved by providing a variation to a flat area.

In order to achieve the above-mentioned objects, a MEMS film for a test socket according to some embodiments of the present invention, which is arranged between a semiconductor device and a test apparatus, includes a flexible bare film and a plurality of round-type MEMS bumps on the bare film, each of the MEMS bumps being formed on the bare film by using a MEMS processing technique, having an electrical contact with an electrode pad of the test apparatus or a conductive ball of the semiconductor device, and having a contact surface rounded from an edge side toward a center side in a convex manner in a direction toward the electrode pad or the conductive ball.

Further, a MEMS film for a test socket according to some embodiments of the present invention, which is arranged between a semiconductor device and a test apparatus, includes a flexible bare film and a plurality of step-type MEMS bumps on the bare film, each of the MEMS bumps being formed on the bare film by using a MEMS processing technique, having an electrical contact with an electrode pad of the test apparatus or a conductive ball of the semiconductor device, and having a contact surface with a height difference.

Moreover, a MEMS film for a test socket according to some embodiments of the present invention, which is arranged between a semiconductor device and a test apparatus, includes a flexible bare film and a plurality of MEMS bumps on the bare film, each of the MEMS bumps being formed on the bare film by using a MEMS processing technique, having an electrical contact with an electrode pad of the test apparatus or a conductive ball of the semiconductor device, and having a contact surface with embossing, where the embossing forms a protruded area configured to prevent a contact fail even when the conductive ball has lateral deviation.

As described above, the following effects can be expected from the configuration according to some embodiments of the present invention.

Firstly, the interval between bumps and the size of the bump can be maintained constant by way of the MEMS process, and hence a fine pitch can be obtained.

Secondly, even when there is a vertical deviation in the height of a ball of the semiconductor device or a horizontal deviation in the size of the ball or the interval between the balls, a contact fail can be prevented by way of a round, a step, or an embossing of the bump.

Thirdly, an influence of the bump can be eliminated by making each bump an island by way of a groove at least partially around the bump, which frees a restriction by a hardened film, and hence a contact property is greatly improved.

BRIEF DESCRIPTION OF THE DRAWINGS

FIGS. 5A and 5B are pictures of a flat-type MEMS bump and data showing a degree of contact fail of the flat-type MEMS bump according to some embodiments of the present invention.

FIGS. 6A to 6D are pictures of round-type MEMS bumps and data showing a degree of contact fail of the round-type MEMS bumps according to some embodiments of the present invention.

FIGS. 7A to 7C are pictures of step-type MEMS bumps and data showing a degree of contact fail of the step-type MEMS bumps according to some embodiments of the present invention.

DETAILED DESCRIPTION OF THE PREFERRED EMBODIMENTS

Figure 1:
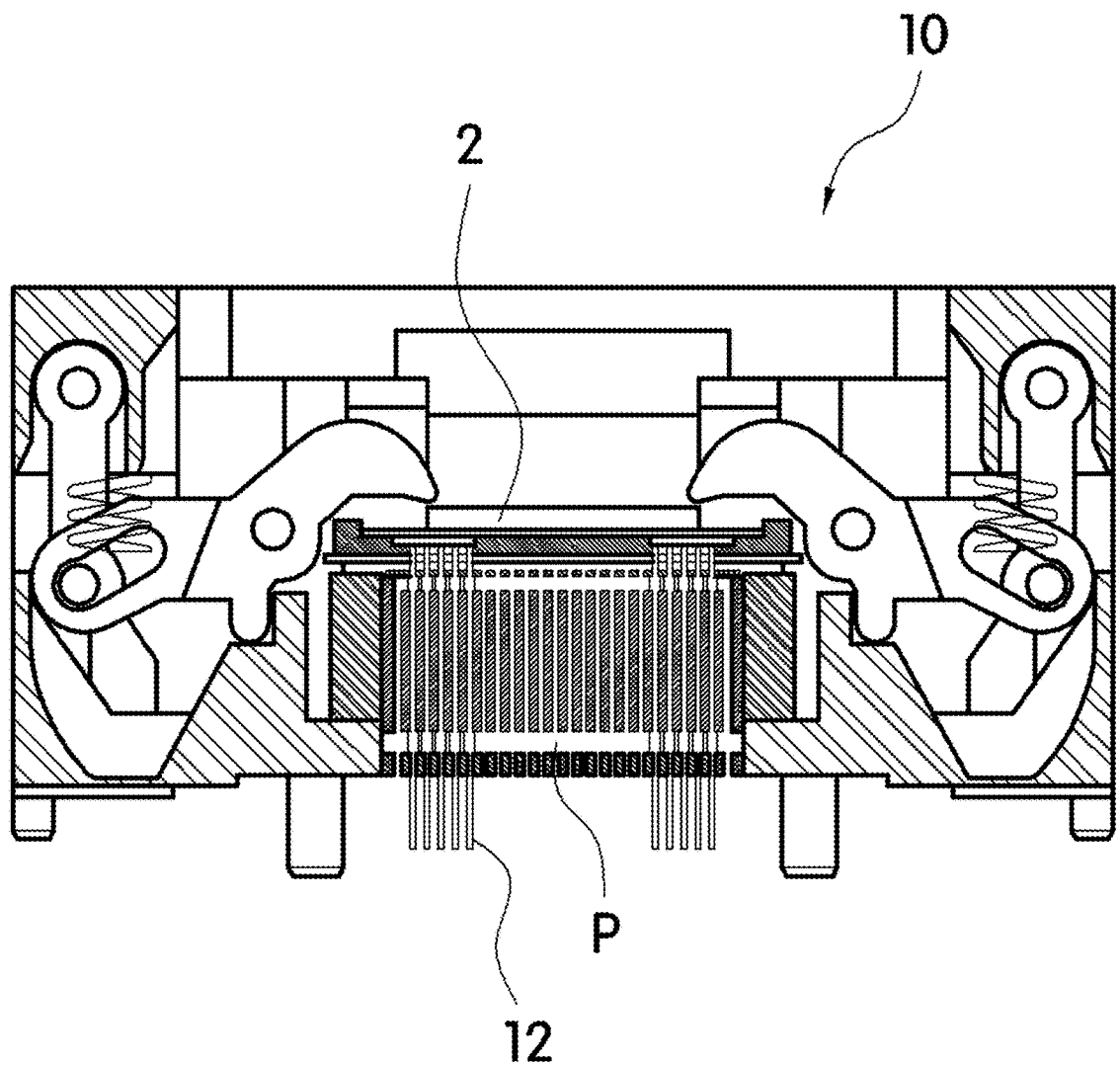
FIG. 1 is a side cross-sectional view of a test socket according to a conventional technology.
Figure 2:
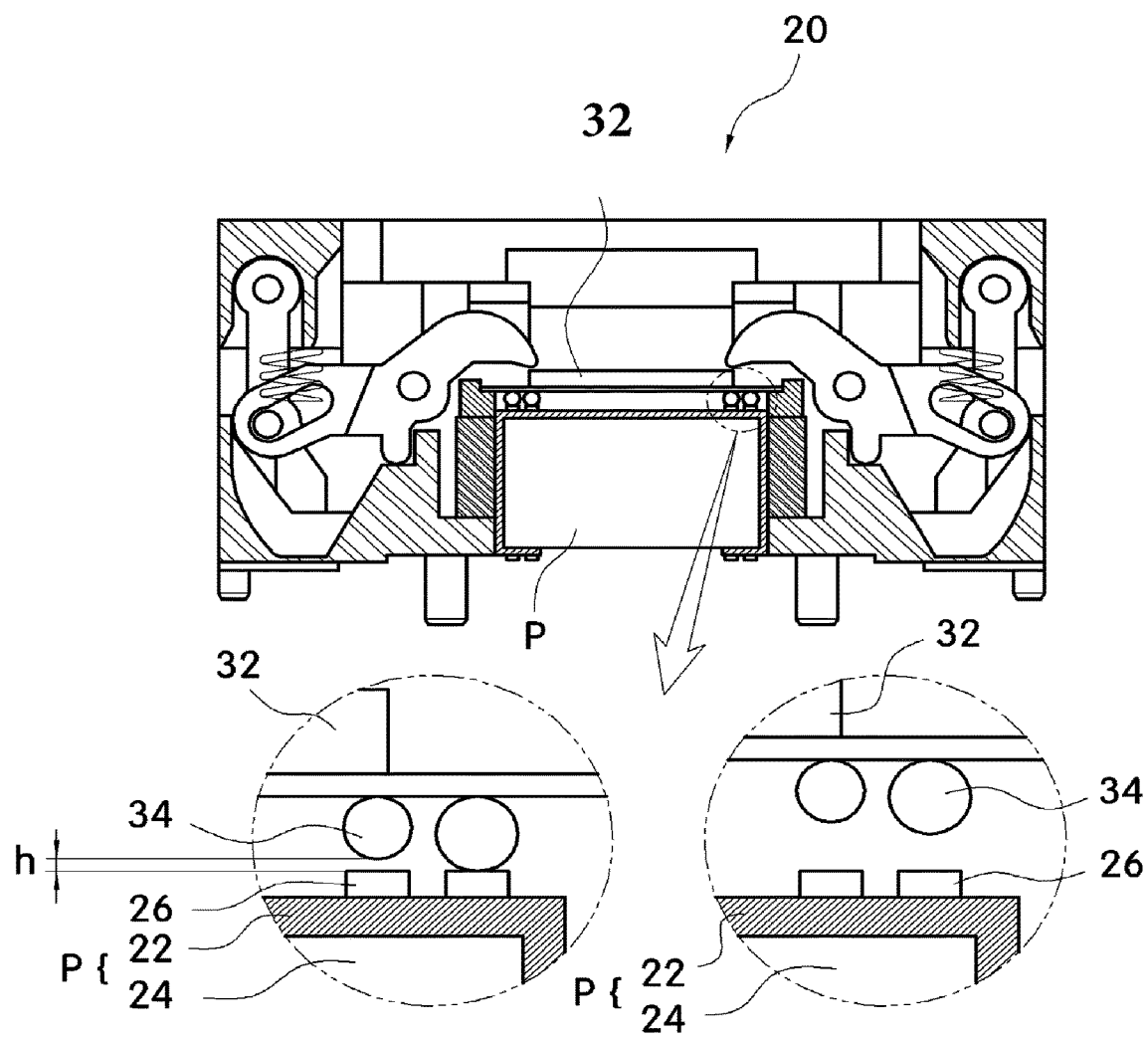
FIG. 2 is a side cross-sectional view of another test socket according to the conventional technology.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A MEMS film for a semiconductor device test socket according to some embodiments of the present invention is described below with reference to the accompanying drawings.

Figure 3:
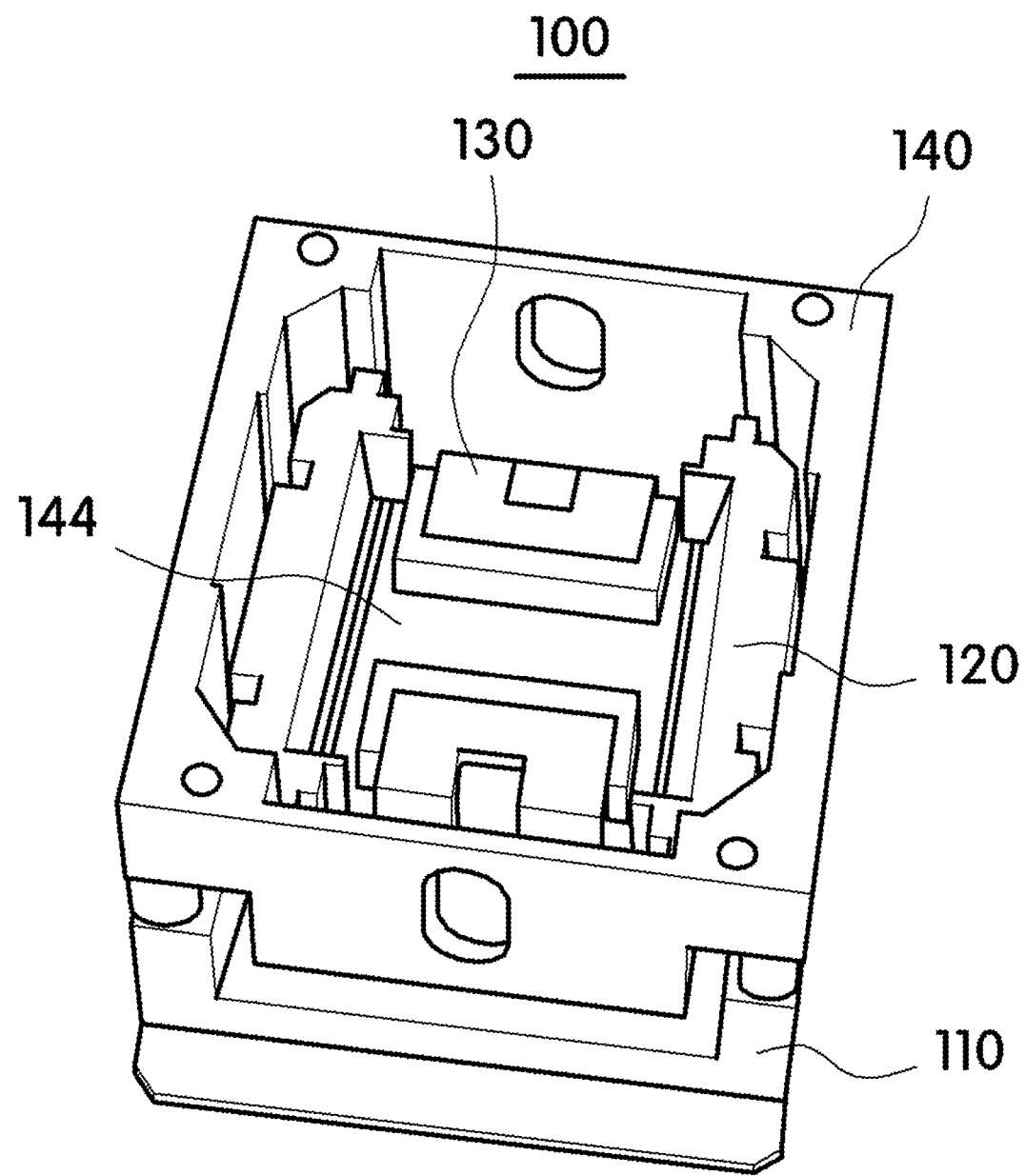
FIG. 3 is a perspective view of a test socket according to some embodiments of the present invention.

Referring to FIG. 3, a test socket 100 according to some embodiments of the present invention is arranged between a semiconductor device such as a semiconductor package and a test apparatus such as a device under test (DUT) board, and performs an electrical test of the semiconductor device.

To this end, the test socket 100 includes a fixed frame 110 that corresponds to a test board of a test apparatus (not shown), a reciprocating frame 120 mounted on the fixed frame 110 in a movable manner in the up and down direction, on which a semiconductor device 102 is mounted, and allowing a MEMS bump 148 (see FIG. 4C) to be brought into contact with or separated from a electrode pad of the test apparatus, a pair of latches 130 mounted on the fixed frame 110 and configured to prevent floating of the semiconductor device 102 (see FIG. 4C), a cover 140 mounted on the fixed frame 110 over the reciprocating frame 120 and configured to provide driving force of the reciprocating frame 120 and the pair of latches 130, and a contact assembly P that electrically connects the test apparatus and the semiconductor device 102 by using a MEMS film 144 fixed on a supporting member of a predetermined shape (not shown).

The MEMS film 144 is mounted on the supporting member having at least an upper surface and a lower surface in a manner that the bare film wraps the supporting member, and in some embodiments, includes a first bump, which is brought into contact with a conductive ball 104 of the semiconductor device 102 in an area corresponding to the upper surface and a second bump, which is brought into contact with an electrode pad of the test apparatus in an area corresponding to the lower surface.

Figure 4A:
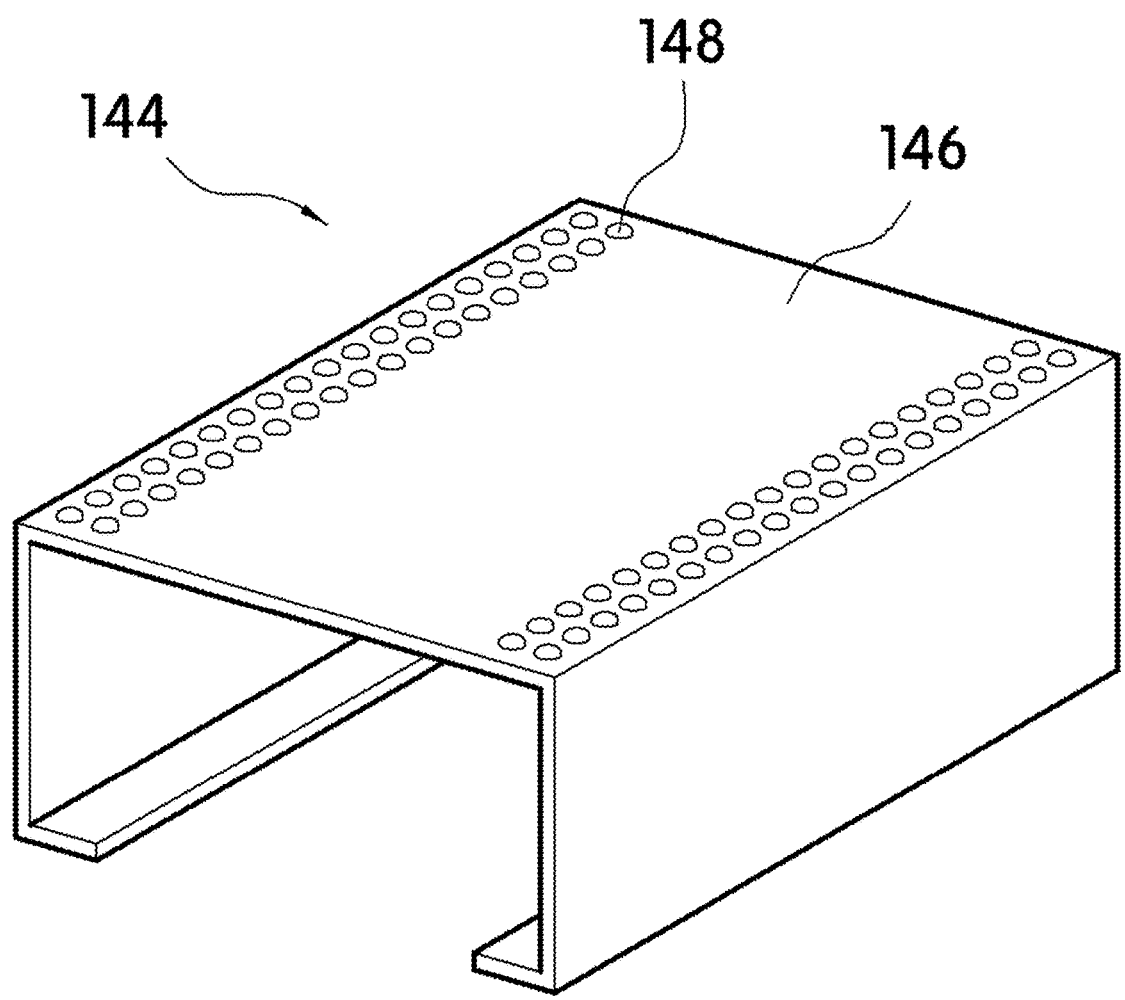
FIGS. 4A, 4B, and 4C are an upper perspective view, a lower perspective view, and a side cross-sectional view of a MEMS film according to some embodiments of the present invention, respectively.
Figure 4B:
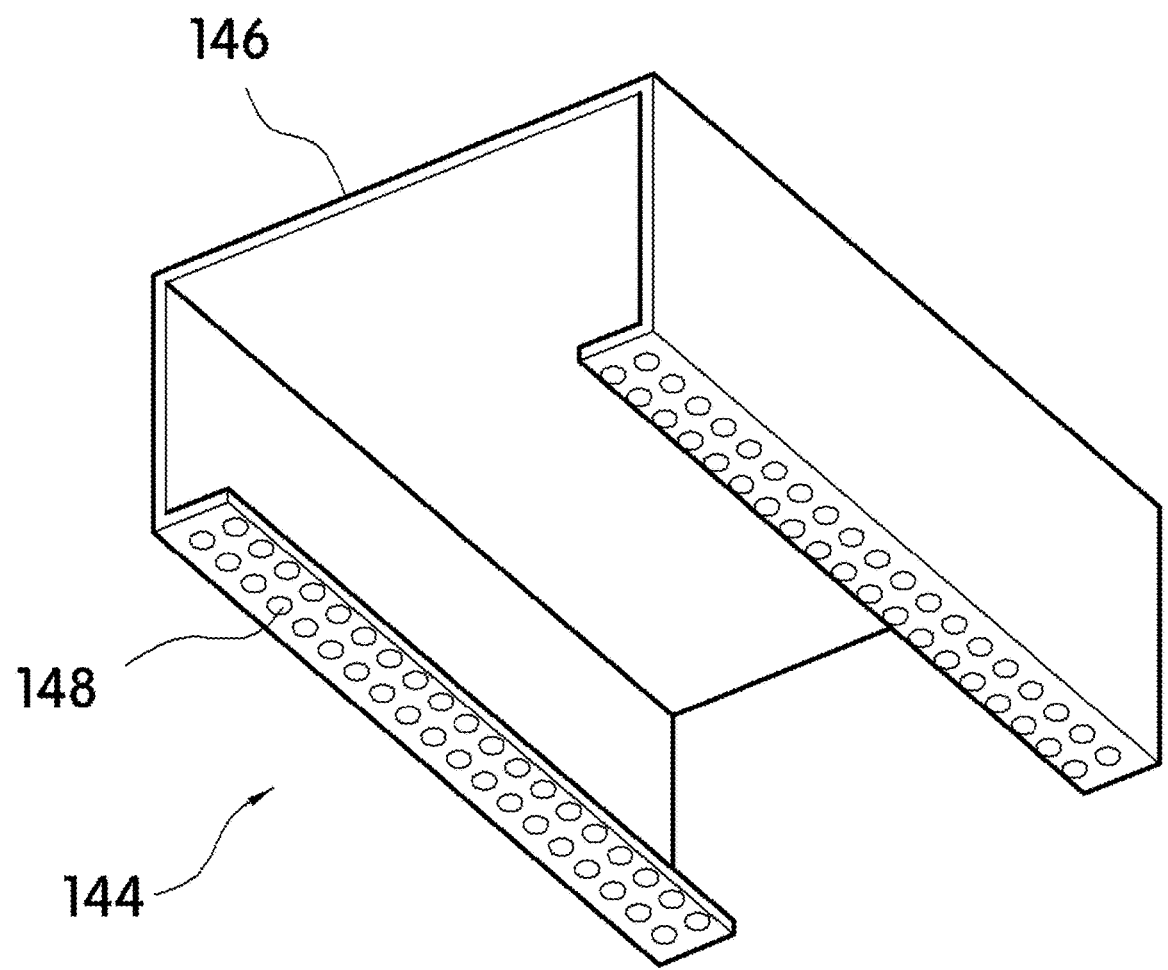
Figure 4C:
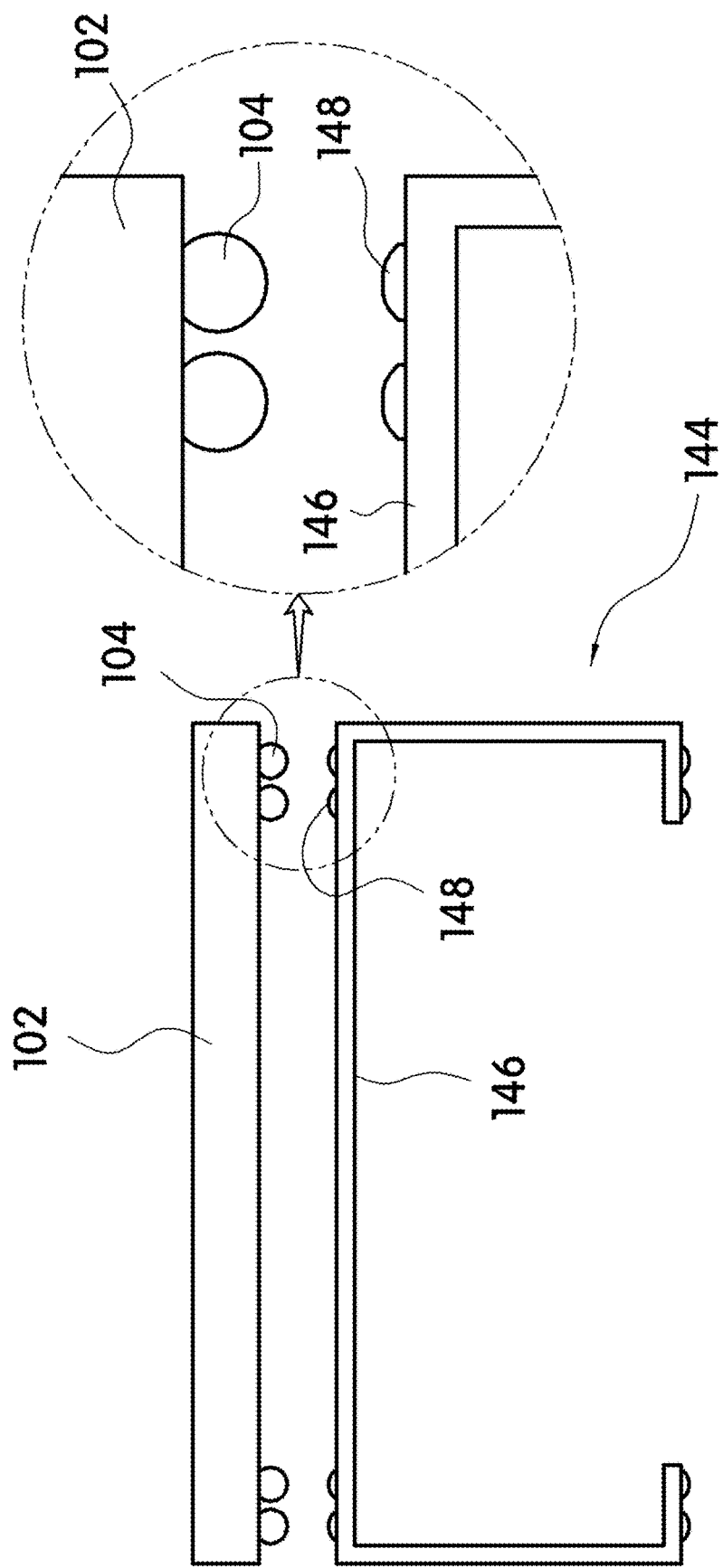

Referring FIGS. 4A, 4B, and 4C, the MEMS film 144 includes a flexible bare film 146 and a plurality of MEMS bumps 148 each being formed on the bare film 146 by way of a MEMS process, having an electrical contact with the electrode pad of the test apparatus or the conductive ball 104 of the semiconductor device 102, and having a contact surface rounded from an edge side toward a center side in a convex manner in a direction toward the electrode pad or the conductive ball 104.

In the drawings, a configuration of a wire pattern that electrically connects the bumps and a passivation layer for insulating the wire pattern is omitted.

The bare film 146 is formed with polyimide (PI) or polyethylene terephthalate (PET) material. The MEMS film 144 is obtained by processing the bare film 146 on a wafer by way of the MEMS technique and the performing a singulation process in which the MEMS film 144 is diced into an individual unit.

The reason why the MEMS film 144 obtained by forming an MEMS element on the polyimide (PI) bare film 146 is used as the contact assembly P in the present disclosure is because the continuity of a process for mass production can be ensured by a roll-to-roll process. Further, it is the most suitable way to achieve a fine pitch by way of the MEMS process. The polyimide (PI) bare film 146 has excellent elastic force and restoring force with excellent property in restoring its original state after a test without causing physical impact or damage on the semiconductor device 102 and the test apparatus. In addition, the polyimide (PI) bare film 146 offers an easy assembly with the test socket 100.

Moreover, when using an elastic member for providing elasticity on the back side of the film, the MEMS film 144 is capable of transferring the elasticity of the elastic member owing to the flexibility thereof. As the MEMS film 144 is mounted on the supporting member (not shown) in a manner that the film wraps the supporting member, the flexibility is a fundamental property. If necessary, a wrapping means can be provided in a wrapping area.

The MEMS bump 148 performs a contact function of making contact with the conductive ball 104 of the semiconductor device 102 or the electrode pad of the test apparatus.

The MEMS bump 148 is formed with electrically conductive material such as gold (Au), silver (Ag), copper (Cu), tungsten (W), titanium (Ti), molybdenum (Mo), nickel (Ni), beryllium (Be), aluminum (Al), or alloy thereof. Such a bump has a natural oxide layer on its surface, which is generated during a process of forming the bump. The natural oxide layer is formed on the contact surface of the bump and affects the conduction with the conductive ball 104 of the semiconductor device 102, and hence it works as a factor for degrading the electrical performance.

Figure 5A:
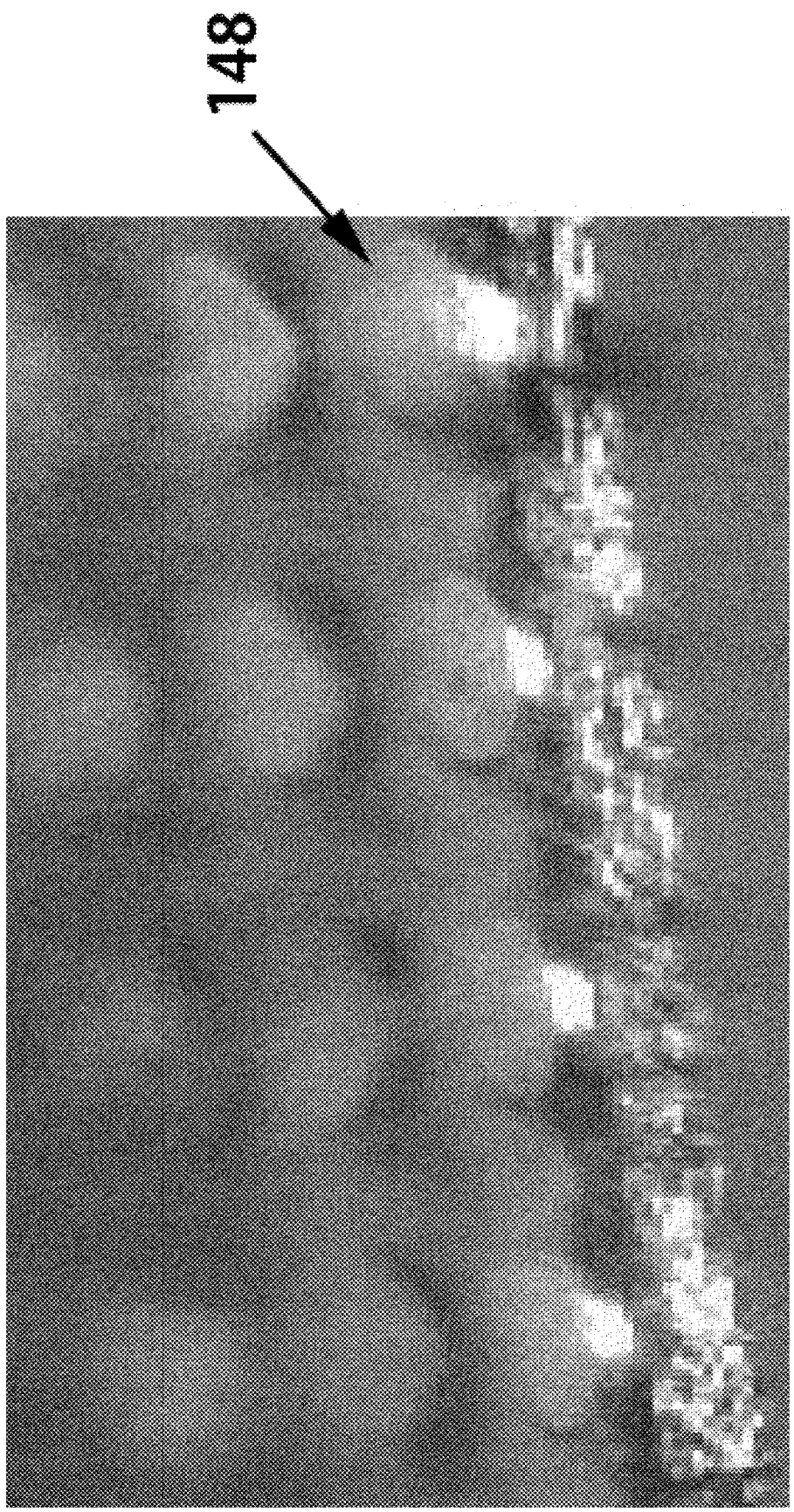

Therefore, as the contact surface of the MEMS bump 148 becomes sharp, the contact property can be enhanced in which the contact is achieved by breaking the natural oxide layer. When the MEMS bump 148 is formed in a flat type as shown in FIG. 5A, when making contact with the conductive ball 104, it may be hard to achieve the electrical contact due to the natural oxide layer. In this case, as shown in FIG. 5B, a number of contact fails are generated.

Figure 6A:
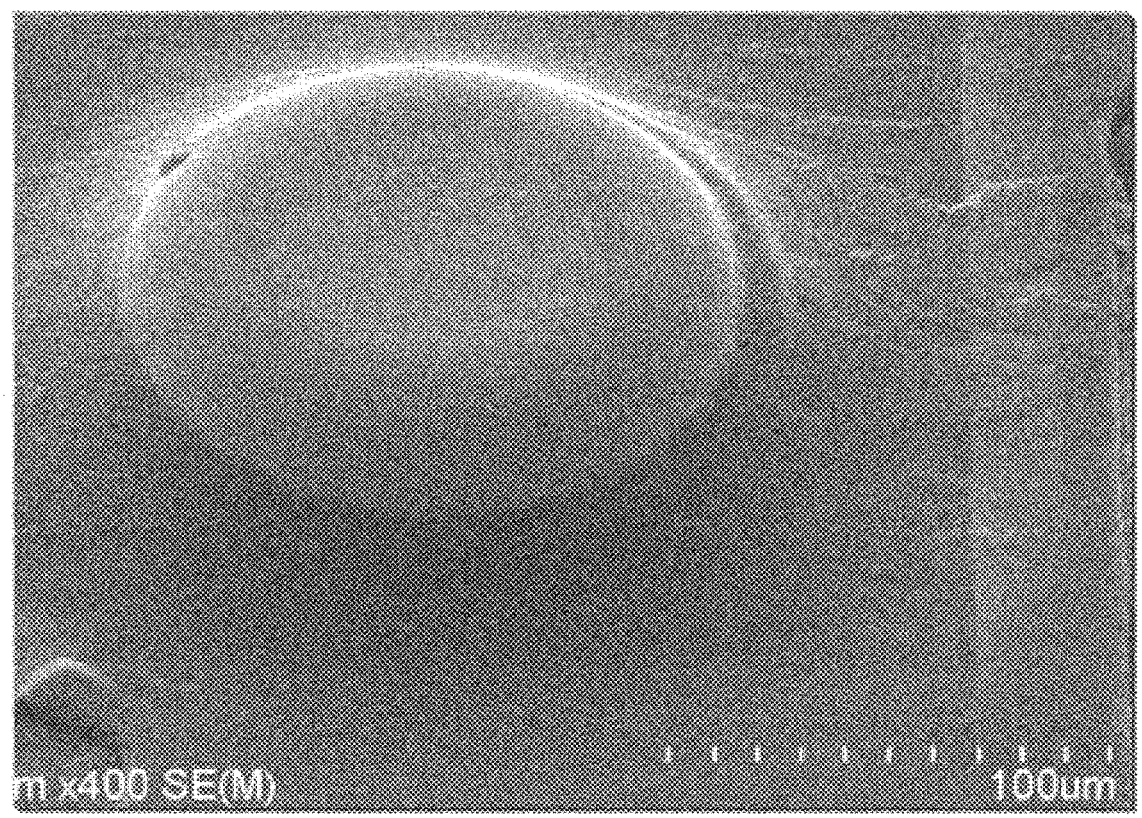
Figure 6B:
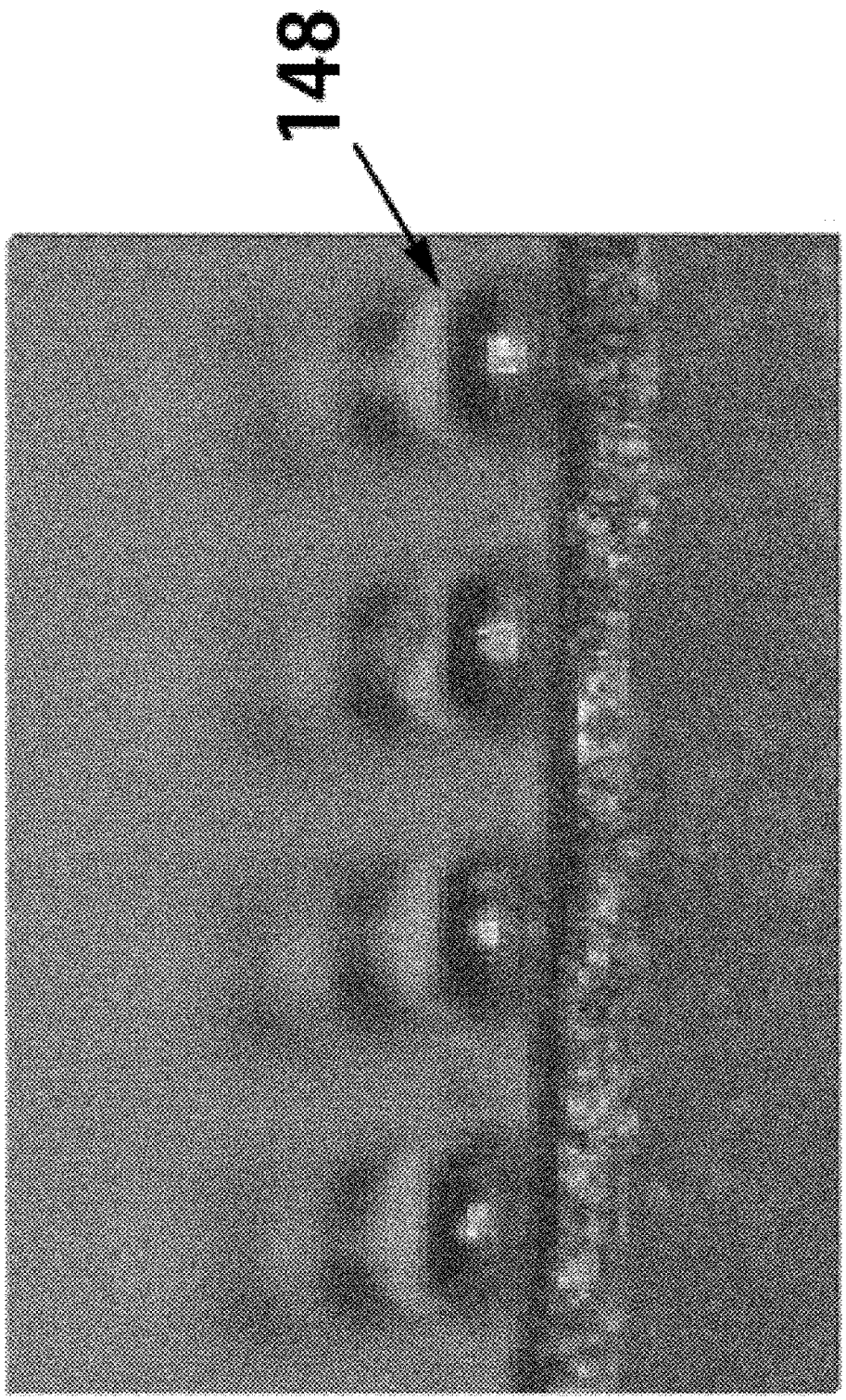
Figure 6C:
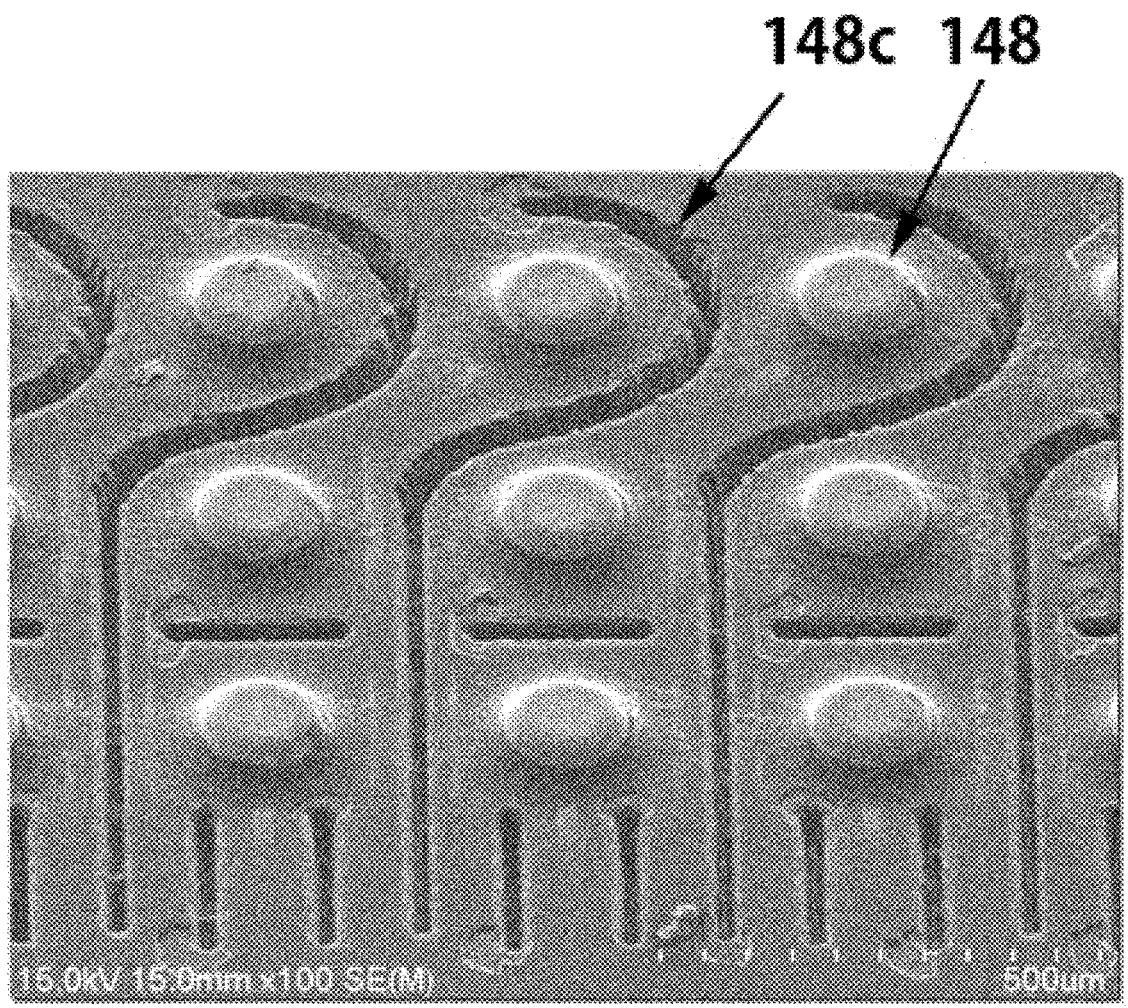
Figure 6D:
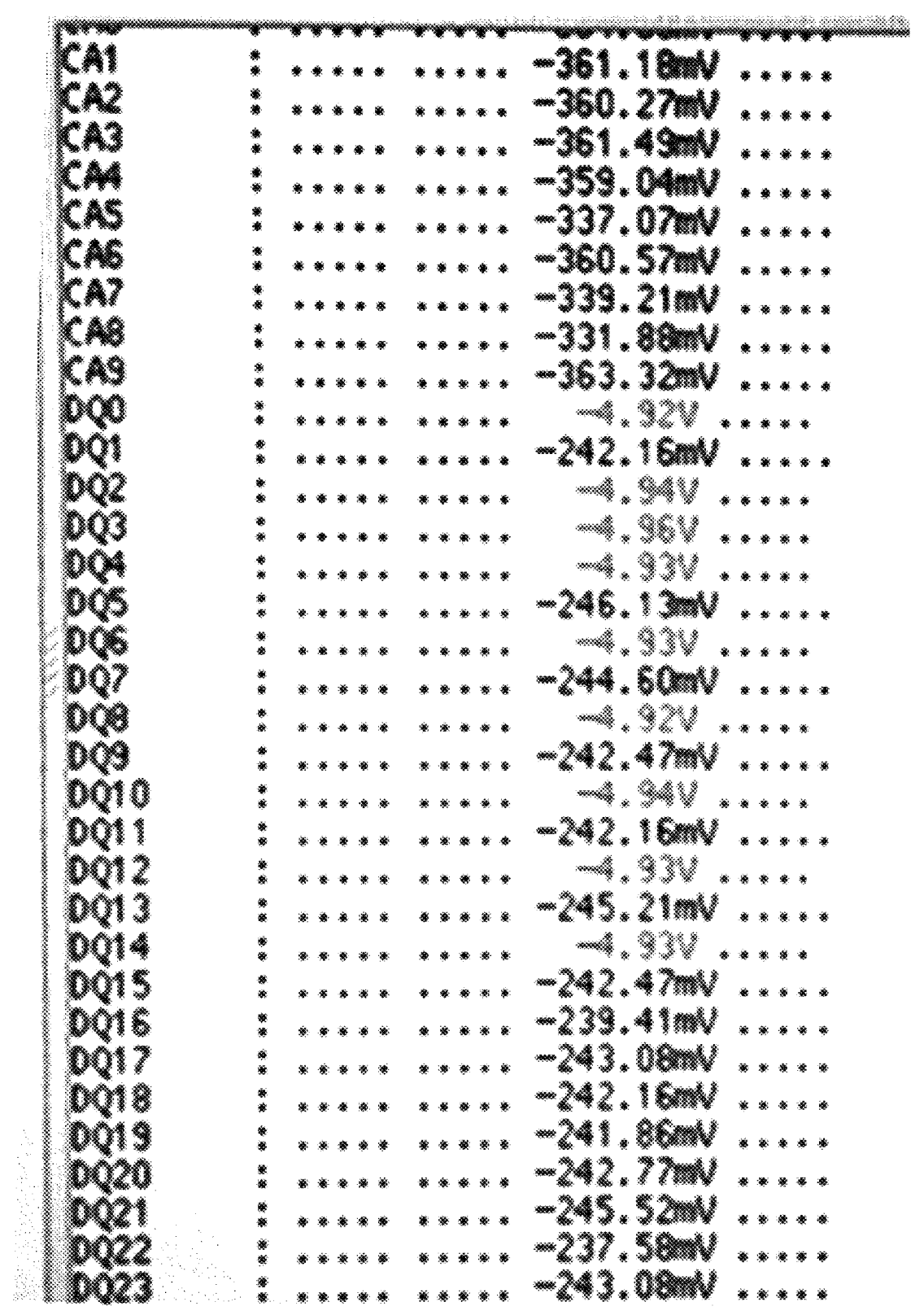

In some embodiments, the MEMS bump 148 is formed in a round type as shown in FIGS. 6A to 6C. With the round-type MEMS bump 148, as shown in FIG. 6D, the contact fails are decreased, compared to the flat type. However, as the round type bump has a protruded area only at the center portion of the bump, the contact fail may still exist.

Figure 7A:
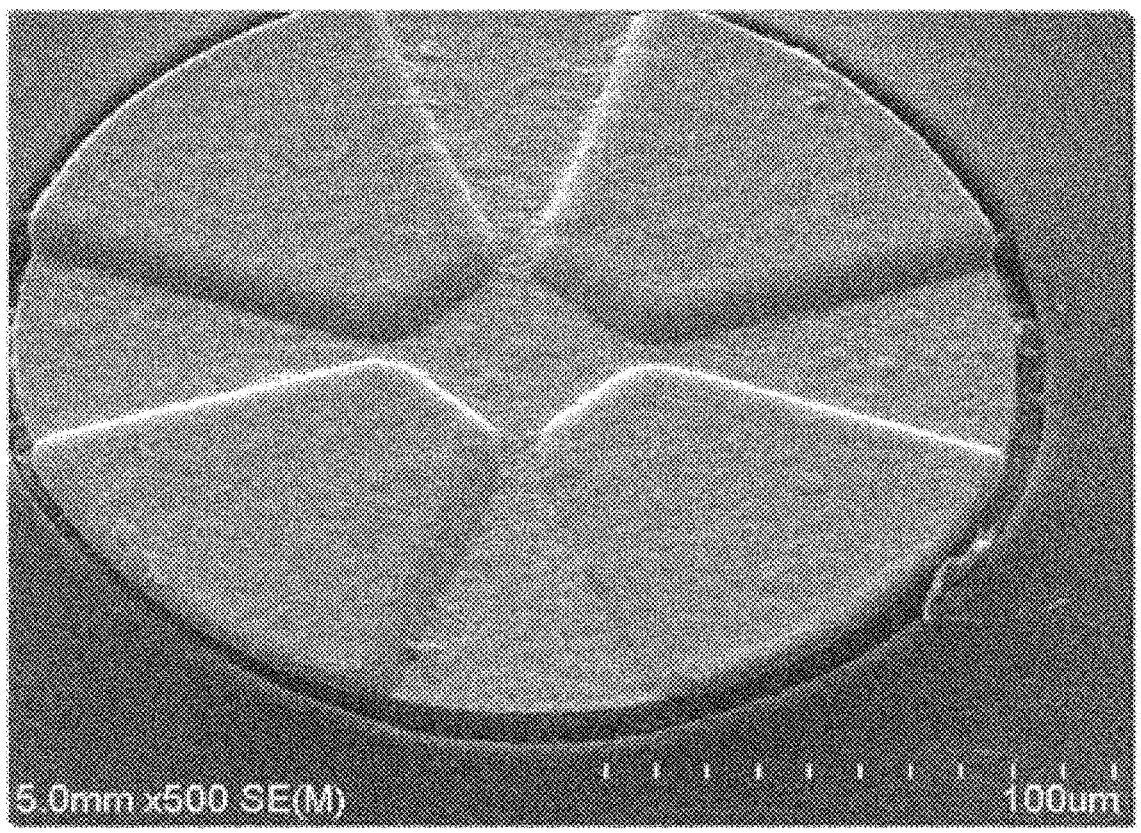
Figure 7B:
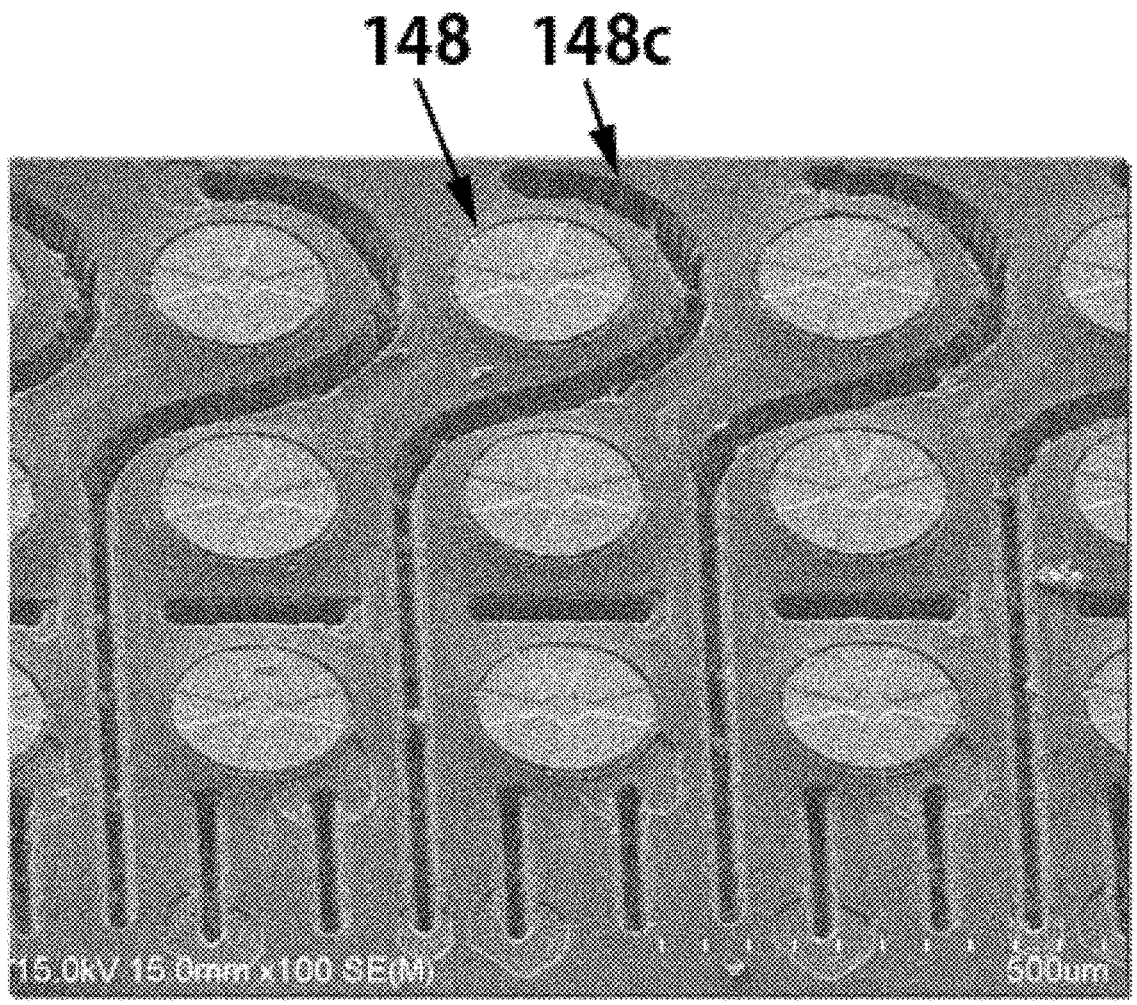

In some embodiments, the MEMS bump 148 is formed in a step type having a height difference as shown in FIGS. 7A and 7B. The step includes an upper step surface and a lower step surface formed in an alternate manner and a protruded area at a boundary of the upper step surface and the lower step surface. The conductive ball 104 is settled on the upper step surface, and the contact with the conductive ball 104 is achieved at the boundary by breaking the natural oxide layer, and hence the overall contact property is improved.

For example, the upper step surface is tapered from the edge side toward the center side, leaving only the lower step surface at the center portion, and hence a plurality of protruded areas is generated at the center portion. With this structure, as shown in FIG. 7C, virtually no contact fails are generated.

Figure 8:
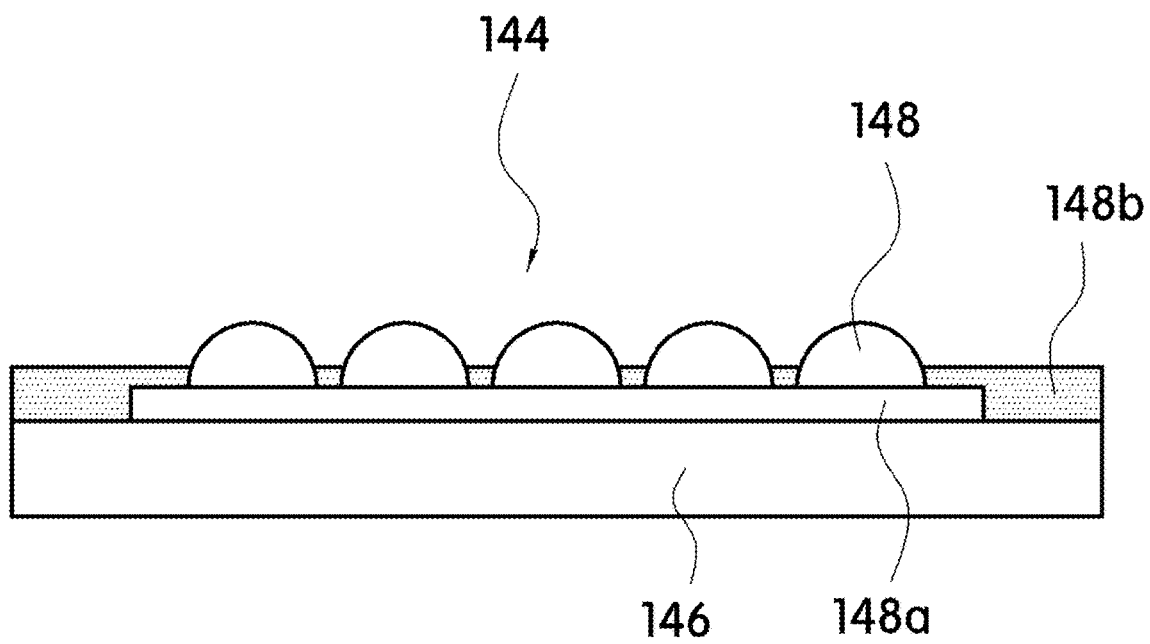
FIG. 8 is a side view of an embossing-type MEMS bump according to some embodiments of the present invention.

In some embodiments, the MEMS bump 148 is formed in an embossing type including a plurality of embossings as shown in FIG. 8. When the MEMS bump 148 is formed in the embossing type, each embossing forms the protruded area, such that a plurality of protruded areas exists uniformly in the entire area, and hence, even when there is a horizontal deviation in the conductive ball 104, the contact fail can be minimized.

A conductive wire pattern 148a for electrically connecting the bumps is formed on the bare film 146, as well as the MEMS bump 148, and a passivation layer 148b for allowing the wire pattern 148a to be covered and the MEMS bump 148 to be exposed is further formed. Specifically, the embossing-type MEMS bump 148 is formed on the wire pattern 148a.

In some embodiments, the MEMS film 144 further includes a groove 148c of a straight or curved shape around each MEMS bump 148 as shown in FIGS. 6C and 7B. The groove 148c is formed by removing a part of the MEMS film 144.

Even when the bare film 146 is formed with polyimide (PI) material, the flexibility shows a certain limit. Further, the height of the MEMS bump 148 has a certain deviation (fluctuation). Therefore, the vertical deviation affects the contact between the conductive ball 104 and the MEMS bump 148. To cope with this problem, in some embodiments of the present invention, the groove 148c having various shapes such as a straight line, a curved line, or the like is formed around the MEMS bump 148 on the MEMS film 144.

In order to allow the MEMS bump 148 to exhibit the contact property independently from other surrounding bumps and to be freed from rigidity of the film without being restricted by the MEMS film 144, the groove 148c can be formed around the MEMS bump 148 of the bare film 146 that is MEMS processed, such that the MEMS bump 148 is brought into contact with the conductive ball 104 of the semiconductor device in a flexible manner.

In some embodiments, the groove 148c is formed by a laser cutting process or an etching process.

As described above, it is found that the present disclosure describes a technical idea with a configuration in which a test socket is manufactured by using a micromachining technique that is used for machining a microelectromechanical structure in units of micrometers, particularly, each bump is provided with flexibility in a manner that the bump is free from an influence of the film and has a capability of actively reacting to the vertical deviation, and each bump is provided with round, step, and embossing to improve the contact property.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A microelectromechanical system (MEMS) film for a semiconductor device test socket, configured to be arranged between a semiconductor device and a test apparatus for performing an electrical test of the semiconductor device, the MEMS film comprising:
   a flexible bare film;
   a plurality of step-type MEMS bumps on the bare film, each of the MEMS bumps being formed on the bare film by using a MEMS processing technique, having an electrical contact with a conductive ball of the semiconductor device, and having a contact surface with a height difference; and
   the flexible bare film forming a straight or curved groove at least partially around each of the MEMS bumps;
   wherein each step-type MEMS bump includes:
      a circular outer perimeter and a center defined by the circular outer perimeter;
      upper and lower step surfaces within the circular outer perimeter, the upper and lower step surfaces alternating angularly about the center of the bump;
      the upper step surfaces are tapered such that the upper step surfaces narrow when moving radially inward from the circular outer perimeter toward the center;
      the lower step surfaces are tapered such that the lower step surfaces narrow when moving radially inward from the circular outer perimeter toward the center; and
      a protruded area between each set of an adjacent upper and lower step surface, the protruded area is configured to prevent a contact fail even when the conductive ball has a horizontal deviation; and the upper step surfaces extend radially inward from the circular outer perimeter toward the center less than the entire radial distance from the circular outer perimeter to the center leaving only the lower step surface at a center portion of each of the MEMS bumps.

2. The MEMS film according to claim 1, wherein:

the upper step surfaces are substantially trapezoidal in shape and are formed between two angularly spaced apart tapered sides that extend between a radially inner side and a radially outer side, the radially outer side being arc shaped and forming part of the circular outer perimeter; and the lower step surfaces are substantially triangular in shape and formed by one tapered side of one adjacent upper step surface and one tapered side of another one of the upper step surface as well as a radially outer side, the radially outer side being arc shaped and forming part of the circular perimeter.

\* \* \* \* \*